United States Patent
OBarske (10) Patent No.: US 11,202,396 B2
(45) Date of Patent: Dec. 14, 2021

(54) ADDITIVE MANUFACTURING OF ENGINE CONTROL COMPONENT

(71) Applicant: Rolls-Royce Corporation, Indianapolis, IN (US)

(72) Inventor: Michael J. OBarske, Brownsburg, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 468 days.

(21) Appl. No.: 15/600,091

(22) Filed: May 19, 2017

(65) Prior Publication Data
US 2018/0338394 A1    Nov. 22, 2018

(51) Int. Cl.
*H05K 9/00* (2006.01)
*B33Y 10/00* (2015.01)
(Continued)

(52) U.S. Cl.
CPC ....... *H05K 9/0007* (2013.01); *B23K 15/0086* (2013.01); *B23K 26/342* (2015.10); *B29C 64/00* (2017.08); *B33Y 10/00* (2014.12); *B33Y 80/00* (2014.12); *F01D 19/00* (2013.01); *F01D 21/003* (2013.01); *H05K 9/0047* (2013.01); *H05K 9/0083* (2013.01); *B23K 2101/36* (2018.08); *B23K 2103/172* (2018.08);
(Continued)

(58) Field of Classification Search
CPC .... H05K 5/0026; H05K 5/003; H05K 5/0034; H05K 5/0043; H05K 5/0047; H05K 5/0056; H05K 5/0082; H05K 9/003; H05K 9/0045; H05K 9/0047; H05K 9/0007
See application file for complete search history.

(56) References Cited

U.S. PATENT DOCUMENTS 5,180,513 A * 1/1993 Durand ................ C09D 11/101
                                                                 174/377
5,566,055 A * 10/1996 Salvi, Jr. .............. H05K 9/0037
                                                                 361/816
(Continued)

FOREIGN PATENT DOCUMENTS

EP          0750453 A2    12/1996
GB          2520817 A      6/2015
WO       2015174993 A1    11/2015

OTHER PUBLICATIONS

Extended Search Report from counterpart European Application No. 18170436.2, dated Oct. 16, 2018, 7 pp.
(Continued)

*Primary Examiner* — James Wu
*Assistant Examiner* — Christopher L Augustin
(74) *Attorney, Agent, or Firm* — Shumaker & Sieffert, P.A.

(57) ABSTRACT

An example control component for controlling an engine component includes a housing. The housing defines a cavity configured to receive control circuitry configured to control the engine. The housing includes an exterior layer defining an exterior surface of the housing and an interior polymeric layer defining an interior surface of the housing. The interior polymeric layer is adjacent to and substantially coextensive with the exterior layer. The interior polymeric layer includes an electrically and thermally conductive material. An example technique includes forming the exterior layer and forming the interior polymeric layer.

20 Claims, 5 Drawing Sheets

(51) Int. Cl.
  *B33Y 80/00* (2015.01)
  *B29C 64/00* (2017.01)
  *B23K 26/342* (2014.01)
  *B23K 15/00* (2006.01)
  *F01D 21/00* (2006.01)
  *F01D 19/00* (2006.01)
  *B23K 101/36* (2006.01)
  *B23K 103/16* (2006.01)

(52) U.S. Cl.
  CPC ...... *F05D 2220/32* (2013.01); *F05D 2230/10* (2013.01); *F05D 2230/21* (2013.01); *F05D 2230/30* (2013.01); *F05D 2300/43* (2013.01)

(56) References Cited

U.S. PATENT DOCUMENTS

| | | | | |
|---|---|---|---|---|
| 5,841,067 | A * | 11/1998 | Nakamura | H05K 9/0045 174/382 |
| 5,872,332 | A * | 2/1999 | Verma | H05K 5/0047 174/373 |
| 6,323,418 | B1 * | 11/2001 | Tiburtius | H05K 9/0015 174/387 |
| 6,709,291 | B1 * | 3/2004 | Wallace | H05K 5/0034 439/607.01 |
| 2004/0120131 | A1 * | 6/2004 | Arnold | H05K 9/003 361/818 |
| 2005/0028999 | A1 * | 2/2005 | Leu | H05K 9/0083 174/386 |
| 2005/0045358 | A1 * | 3/2005 | Arnold | H05K 9/0024 174/51 |
| 2005/0224280 | A1 * | 10/2005 | Aisenbrey | B29C 45/0013 181/148 |
| 2009/0265931 | A1 * | 10/2009 | Cheng | H05K 9/003 29/887 |
| 2009/0283319 | A1 * | 11/2009 | Hsieh | H05K 7/20509 174/350 |
| 2014/0272117 | A1 * | 9/2014 | Aisenbrey | H01B 13/0026 427/124 |
| 2016/0066481 | A1 | 3/2016 | Malek et al. | |
| 2016/0169012 | A1 | 6/2016 | DaCunha et al. | |
| 2017/0290207 | A1 * | 10/2017 | Smith | H05K 9/0024 |
| 2018/0007818 | A1 * | 1/2018 | Toleno | H05K 9/003 |

OTHER PUBLICATIONS

Response to Communication pursuant to Rules 69 and 70a(1) dated Nov. 26, 2018, from counterpart European Application No. 18170436. 2, filed May 21, 2019, 52 pp.

* cited by examiner

FIG. 5

ADDITIVE MANUFACTURING OF ENGINE CONTROL COMPONENT

TECHNICAL FIELD

The present disclosure relates to control components for engines, in particular, components for monitoring and controlling engines.

BACKGROUND

Components such as a full authority digital engine controller (FADEC) may monitor and control gas turbine engine parameters to operate engines within predetermined tolerances for reliability and safety. For example, a FADEC may continuously receive data indicative of engine properties such air pressure and engine temperature, and of the health or state of engine subcomponents. In response to the data, the FADEC may regulate fuel flow, ignition, and thrust, by sending actuating signals to valves, pumps, or other components to operate the engine efficiently and safely. FADECs may include or supplement engine monitoring or control components such as electronic engine controllers (EECs) or engine health monitoring systems (EHMs).

SUMMARY

In some examples, the disclosure describes an example control component for controlling an engine. The control component includes a housing. The housing defines a cavity configured to receive control circuitry configured to control the engine. The housing includes an exterior layer defining an exterior surface of the housing and an interior polymeric layer defining an interior surface of the housing. The interior polymeric layer is adjacent to and substantially coextensive with the exterior layer. The interior polymeric layer includes an electrically and thermally conductive material. In some examples, the electrically and thermally conductive material may shield the control circuitry from electromagnetic interference.

In some examples, the disclosure describes an example technique for fabricating an engine component. The technique includes forming an exterior layer defining an exterior surface of a housing of a control component and forming an interior polymeric layer defining an interior surface of the housing. The interior polymeric layer includes an electrically and thermally conductive material. The housing defines a cavity configured to receive control circuitry. The control circuitry is configured to control an engine.

The details of one or more examples are set forth in the accompanying drawings and the description below. Other features, objects, and advantages will be apparent from the description and drawings, and from the claims.

DETAILED DESCRIPTION

The disclosure generally describes control components for monitoring and controlling engines. In some examples, the disclosure describes a control component for controlling a combustion-cycle based engine such as a gas turbine engine. The control component may include a housing including an exterior layer and an interior polymeric layer. The interior polymeric layer may include an electrically and thermally conductive material. In some examples, the disclosure describes example techniques for forming control components. The techniques may include forming the exterior layer and forming the interior polymeric layer adjacent to and substantially coextensive with the exterior layer, for example, using additive manufacturing.

Control components for monitoring and controlling engines (for example, gas turbine engines) may include electronic engine controllers (EECs), electronic controls units (ECUs), engine health monitoring units (EHMs), data acquisition units (DAUs), full authority digital engine controller (FADECs), or combinations thereof (collectively described as control components in this disclosure). The "control" in this disclosure collectively refers to one or both of control or monitoring of engines. A control component may be mounted on or adjacent to the engine, and includes control circuitry electrically coupled to the engine or engine subcomponents for monitoring and controlling the operation of the engine. Interference with or damage to control circuitry may affect engine monitoring and control. For example, phenomenon such as overheating, sparks, electromagnetic interference, electromagnetic pulses (EMPs), stray charges, gamma rays, or lightning may interfere with or damage control circuitry. Such interference or damage may reduce engine efficiency, lead to intermittent problems with engine operation, or may even lead to engine shutdown, stall, or failure. Control components may provide redundant or backup components to provide for uninterrupted engine control, for example, by providing backup power sources and backup modules for control circuitry. Control circuitry may be shielded to provide additional protection from damage or interference.

In some examples, control components according to the disclosure may protect or shield control circuitry, while having relatively low weights, relatively low costs, and example techniques according to the disclosure may be used to manufacture components with relatively short manufacturing times, e.g., compared to housings formed from metals or alloys. For example, a control component may include a housing including an exterior layer and an interior polymeric layer. The housing defines a cavity configured to receive the control circuitry. The interior polymeric layer of the housing may include an electrically and thermally conductive material. Thus, the electrically and thermally conductive material of the interior polymeric layer may provide a path for dissipating heat and electricity away from the control circuitry in the cavity defined by the housing. The electrically and thermally conductive material may also define a faraday cage that shields the control circuitry from EMPs or other electromagnetic interference. One or both of the interior polymeric layer and the exterior layer may provide structural rigidity or strength to protect the control circuitry from stress, vibrations, and mechanical damage. Providing a polymeric layer as one or both of the interior and the exterior layer may reduce weight. In some examples, the housing may be unitary and define a substantially continuous interior polymeric layer and exterior layer or a seamless or gradual transition between the interior polymeric layer and the exterior layer.

Figure 1A:
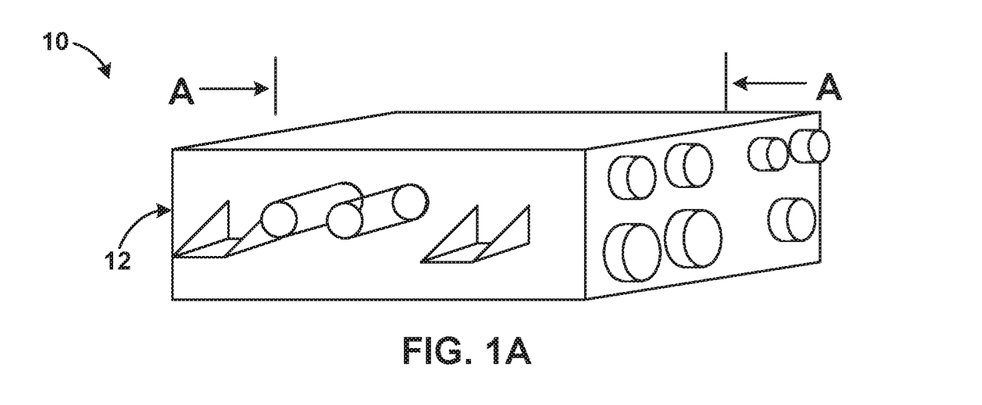
FIG. 1A is conceptual perspective view of an example control component for controlling an engine, the control component including a housing.
Figure 1B:
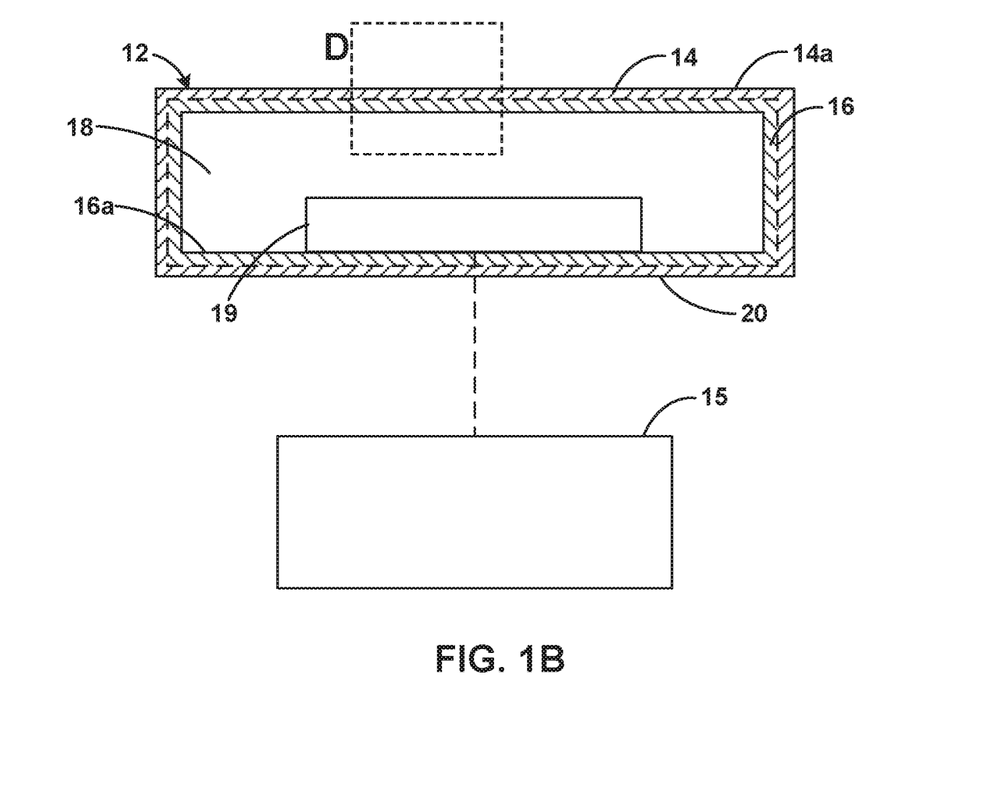
FIG. 1B is conceptual cross-sectional view of the housing of the control component of FIG. 1A, the housing including an exterior layer and an interior polymeric layer.
Figure 1C:
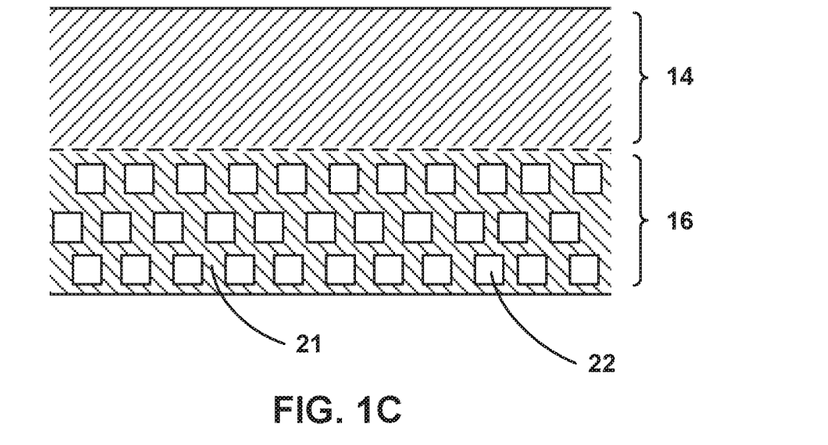
FIG. 1C is conceptual magnified cross-sectional view of a portion of the housing of FIG. 1B.

FIG. 1A is conceptual perspective view of an example control component 10 for controlling an engine (not shown in FIG. 1A), control component 10 including a housing 12. FIG. 1B is conceptual cross-sectional view of housing 12 of control component 10 of FIG. 1A. FIG. 1C is conceptual magnified cross-sectional view of a portion (marked D in FIG. 1B) of housing 12 of FIG. 1B. Housing 12 includes an exterior layer 14 and an interior polymeric layer 16. Housing 12 may define a cavity 18, and cavity 18 may be configured to receive control circuitry 19. Control circuitry 19 may be electronically coupled to engine 15, or otherwise coupled in any manner that allows data and control signals to be exchanged between control circuitry 19 and engine 15, so that control circuitry 19 can monitor and control engine 15. Engine 15 may include a gas engine (for example, an automobile engine), a diesel engine, a gas turbine engine (for example, aviation or jet engines), or a combustion engine.

As described elsewhere in the disclosure, control component 10 may be mounted on, to, or adjacent engine 15, or on a structure of a vehicle or aircraft including engine 15. For example, housing 12 of control component 10 may be mounted on, to, or adjacent engine via a gasket, seal, flange, foam, or another structure for reducing or damping vibrations originating from engine 15 or another component. Housing 12 may protect or shield control circuitry 19 from damage or interference. In some examples, at least a portion of housing 12 may be substantially rigid or otherwise capable of absorbing or deflecting mechanical shocks. For example, exterior layer 14 of housing 12 may be substantially rigid. Exterior layer 14 may include one or more of a metal, an alloy, a ceramic, a polymer, or a composite material. The composite material may include carbon-composites (for example, carbon-fiber laminates or carbon-reinforced plastic), or metallic embedded polymers, or any other suitable composite material. In some examples, exterior layer 14 consists essentially of a polymer (excluding minor contaminants, impurities, pigments, colorants, or dopants). Exterior layer 14 defines an exterior surface 14a of housing 12.

Housing 12 also includes interior polymeric layer 16 adjacent to and substantially coextensive with exterior layer 14, as seen in FIGS. 1B and 1C. Interior polymeric layer 16 defines an interior surface 16a of housing 12. For example, interior surface 16a of housing 12 may define cavity 18, as shown in FIG. 1B. Interior polymeric layer 16 may include a polymer matrix 21 that includes a polymer. The polymer may include a thermoplastic, a thermoset, or any suitable polymer. For example, polymer matrix 21 may include one or more of acrylonitrile butadiene styrene (ABS), polylactic acid (PLA), nylon, polyethylene, polycarbonate, polypropylene, polyvinyl chloride (PVC), polyether sulfone, polymethyl methacrylate (PMMA), polyoxymethylene (POM). In some examples, polymer matrix 21 itself may not be conductive (e.g., may have a relatively low electrical conductivity, thermal conductivity or both, such that polymer matrix 21 is substantially electrically insulating, thermally insulating, or both).

In examples in which polymer matrix 21 does not include a conductive material, interior polymeric layer 16 may include a conductive material 22. Conductive material 22 may include a metal, an alloy, or a conductive polymer. In other examples, polymer matrix 21 may itself be conductive, for example, by including a conductive polymer. The conductive polymer in matrix 21 or conductive material 22 may include one or more of carbon-, graphene-, metal-, or alloy-embedded or impregnated polymer. In some examples, the conductive polymer may include a conductive polylactic acid (PLA), for example, Proto-pasta Conductive PLA (ProtoPlant, Vancouver, Wash.), or another conductive polymer, for example, Graphene 3D (Black Magic 3D, Calverton, N.Y.), Therma-Tech™ (PolyOne, Avon Lake, Ohio), Chromerics (Parker Hannifin, Cleveland, Ohio), or UltraConductive™ (Lord Aerospace, Cary, N.C.). The conductive polymer may include a non-conductive polymer with a non-polymer additive, for example, one or more of carbon, graphene, or silver.

While one conductive material 22 is shown in FIG. 1C, in other examples, interior polymeric layer 16 may include more than one conductive material, for example, a first conductive material that is thermally conductive, and a second material that is electrically conductive. In some examples, conductive material 22 is both electrically and thermally conductive. In some examples, conductive material 22 or matrix 21 consists essentially of the conductive polymer (excluding minor impurities, contaminants, dopants, and other minor components). The conductive polymer may be relatively lighter than a metal or an alloy, and using the conductive polymer may maintain the weight of control component 12 within a target weight range. Control circuitry 19 may be electrically or thermally coupled to conductive material 22 or to conductive matrix 21, for example, by a wire, a trace, a heat sink, a thermally conductive adhesive, or another suitable electrically or thermally conductive path.

In some examples, interior polymeric layer 16 may include conductive material 22 distributed or dispersed in a predetermined pattern within a matrix 21 of interior polymer layer 16, as shown in FIG. 1C. For example, conductive material 22 may form a grid, a mesh, a continuous layer, a plurality of connected or partially connected clusters, or any other suitable pattern providing an electrically or thermally conductive path. In other examples, conductive material 22 may not form a geometric pattern, and instead be uniformly or substantially uniformly dispersed or distributed within interior polymeric layer 16. For example, particles, clusters, or agglomerates of conductive material 22 may be dispersed within a bulk (or matrix) of interior polymeric layer 16. In some examples, interior polymeric layer 16 may not include a separate conductive material 22, and instead, interior polymeric 16 may consist of or consist essentially of conductive material 22 (excluding, for example, impurities, dopants, or contaminants). For example, conductive material 22 may include a conductive polymer, and interior polymeric layer 16 may consist essentially of the conductive polymer. In other examples, conductive material 22 may include the conductive polymer, and matrix 21 of interior polymer 16 may include a second polymer different from the conductive polymer. The second polymer may or may not be a conductive polymer.

Thus, at least a portion of housing 12 may provide one or both of a thermally or electrically conductive path, to dissipate heat, electricity, or both away from control circuitry 19. In some examples, the electrical conductivity of conductive material 22 may be measured or defined in terms of electrical resistivity, which is the inverse of conductivity. For example, the lower the resistivity, the higher the conductivity. In some examples, the resistivity of conductive material 22 is less than 0.15 ohm meter, for example, any suitable value between $2.65 \times 10^{-8}$ oh meter and 0.15 ohm meter. In some examples, the thermal conductivity of conductive material 22 is at least 1 W/mK (Watt per meter Kelvin), for example, at least 5 W/mK, or at least 10 W/mK.

While exterior layer 14 may be separate or distinct from interior polymeric layer 16 with an interface separating the layers in some examples, in other examples, exterior layer 14 may be continuous with interior polymeric layer 16. For example, interior polymeric layer 16 may seamlessly transition into exterior layer 14 such that there is no distinct interface. Exterior layer 14 and interior polymeric layer 16 may include the same polymer, and the polymer may define polymer matrix 21 that extends continuously through both interior polymeric layer 16 and exterior layer 14. In some examples, housing 12 may include a unitary structure or a monolithic structure defining exterior layer 14 and interior polymeric layer 16. Further, while conductive material 22 may be included in interior polymeric layer 16, in some examples, some conductive material 22 may also be present in exterior polymeric layer 14. For example, conductive material 22 may be present in a relatively high concentration in interior polymeric layer 16, and a relatively lower concentration in exterior polymeric layer 14. Housing 12 may define a gradient of concentration of conductive material 22 between interior surface 16a defined by interior polymeric layer 16 and exterior surface 14a defined by exterior layer 14. In some examples, housing 12 may not include a separate exterior layer 14, and instead consist of a single layer, such that a first portion of the single layer defines exterior layer 14, and a second portion of the single layer defines interior polymeric layer 16. Housing 12 may shield or protect control circuitry 19 from damage or interference. For example, housing 12, or a layer or a portion of housing 12, may define a faraday cage for shielding circuitry 19 from electromagnetic interference, as described with reference to FIG. 2.

Figure 2:
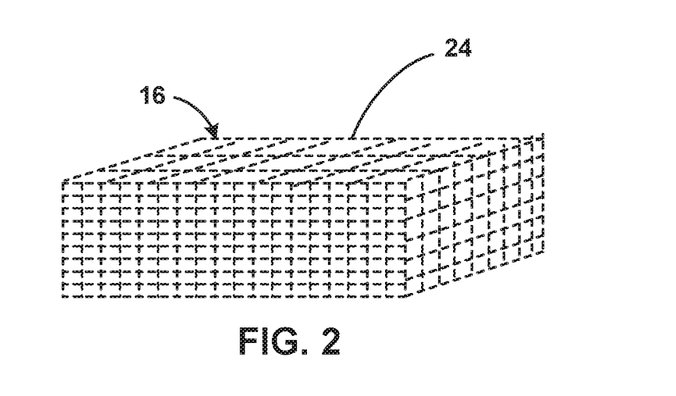
FIG. 2 is a conceptual and schematic illustration of a faraday cage defined by the interior polymeric layer of FIG. 1B.

FIG. 2 is a conceptual and schematic illustration of a faraday cage 24 defined by interior polymeric layer 16 of FIG. 1B. A faraday cage is a cage, mesh, or gridded structure that blocks or attenuates the transmission of predetermined electromagnetic wavelengths. In some examples, housing 12 may include a faraday shield instead of, or in addition to, faraday cage 24. A faraday shield is a substantially continuous enclosure that blocks or attenuates the transmission of predetermined target electromagnetic wavelengths. In examples in which interior polymer layer 16 includes conductive material 22, conductive material 22 may define faraday cage 24. In examples in which matrix 21 of interior polymeric layer 16 is conductive, matrix 21 itself may define faraday cage 24 or a substantially continuous faraday shield. While faraday cage 24 may be in the form of a uniform grid or mesh as shown in FIG. 2, in other examples, faraday cage 24 may be in the form of any suitable pattern or distribution defined by conductive material 22. Housing 12 may also shield or protect control circuitry 19 from EMPs or other electromagnetic interference by providing a faraday cage around, about, or surrounding, at least a portion of control circuitry 19. Faraday cage 24 may have a geometry designed to attenuate a predetermined range of electromagnetic frequencies (or wavelengths), for example, a predetermined average inter-mesh spacing or a range of inter-mesh spacings, a thickness, or another intra-cage dimension, that may regulate frequencies blocked by faraday cage 24. In some examples, pores or voids defined by faraday cage 24 may be smaller than a target blocked wavelength. Faraday cage 24 may include more than one sub-cage, each respective sub-cage for blocking or attenuating different or overlapping target wavelengths or wavelength ranges. Faraday cage 24 may thus shield cavity 18 from electromagnetic interference, including components within cavity 18, for example, control circuitry 19.

In some examples, faraday cage 24 may also provide a thermally and electrically conductive pathway for dissipating heat and electrical current or charge away from control circuitry 19. In other examples, faraday cage 24 may be isolated from control circuitry 19, and another portion of conductive material 22 or matrix 21 may provide a thermally or electrically conductive path coupled to control circuitry 19.

Thus, housing 12 of control component 10 may shield or protect control circuitry 19 within control component 10. One or more components or portions of housing 12 of control component 12 may be formed using additive manufacturing, as described elsewhere in the disclosure. For example, one or both of exterior layer 14 or interior polymeric layer 16 may be formed using additive manufacturing. However, other components of control component 10 may be formed by additive manufacturing, for example, one or more components of control component 10 described with reference to FIG. 3.

Figure 3:
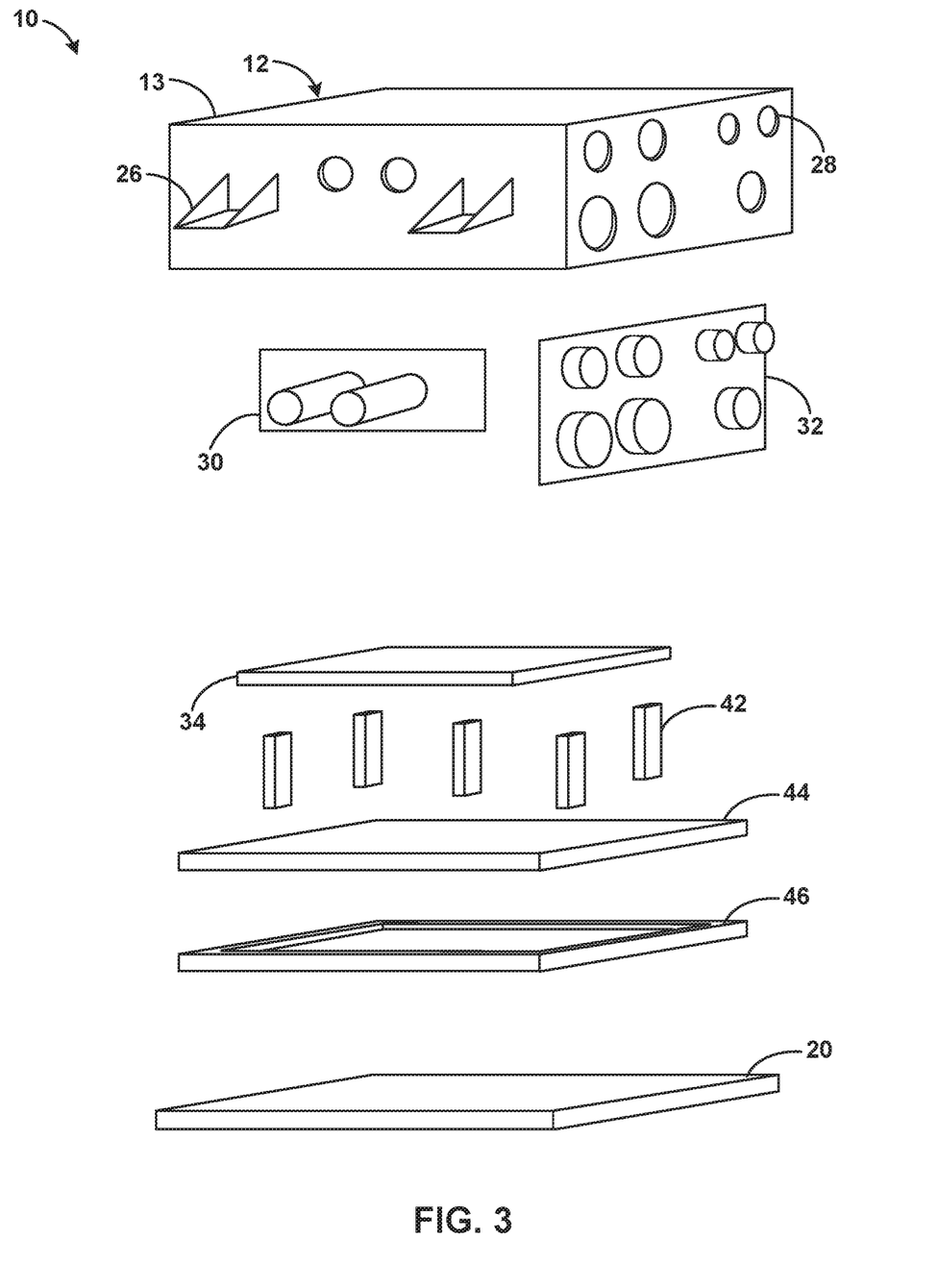
FIG. 3 is a schematic and conceptual exploded view of the control component of FIG. 1A.

FIG. 3 is a schematic and conceptual exploded view of control component 10 of FIG. 1A. Control component 10 includes housing 12. While housing 12 is shown as substantially continuous in the example shown in FIG. 1B, in other examples, housing 12 may include one or more parts or components that are joined, welded, attached, or otherwise assembled together. For example, housing 12 may include a case 13 and a base 20, as shown in FIG. 3. One or both of case 13 or base 20 may define or include one or more portions of exterior layer 14 or interior polymeric layer 16. Sub-components or modules of control component 10, for example, control circuitry 19, may be assembled within a cavity partly defined by case 13, and then base 20 and case 13 may be coupled with base 20 to form housing 12 enclosing sub-components of control component 10. In some examples, base 20 may be secured by fasteners, clips, groove-tongue joints, screws, bolts, adhesives, hinges, threads, or other fastening means to case 13. Case 13 may define mounting brackets 26 and openings 28. Mounting brackets 26 may be used to mount control component 10 on engine, for example, by using fasteners, bolts, welds, joints, or any other suitable mounts.

One or more sub-components of control component 10 may define protrusions that may protrude through openings 28. For example, control component 10 may include a pressure sensor card 30 and an external interface module that may respectively define protruding portions that protrude through openings 28. Pressure sensor card 30 may include at least one pressure sensor for sensing a pressure in a vicinity of control component 10. External interface module 32 may provide an interface between control circuitry 19 and external circuitry, for example, circuitry of a flight computer or a cockpit console operated by a computer or a pilot.

Control component 10 may include a power supply, one or more power supplies for supplying power to control circuitry 19 or other components. The power supply may include a primary power supply and a secondary or backup power supply. Control circuitry 19 may be mounted on or to a circuit board 34. Control component 10 may include one or more spacers 42 for spacing apart two or more sub-components. For example, spacers 42 may space apart power supplies circuit board 34 and second circuitry 44. One or both of control circuitry 19 or second circuitry 44 may include a cockpit interface module (CIM), a health monitoring module, or other modules that monitor or control engine 15. For example, the cockpit interface module may include circuitry for interfacing control component 10 with a cockpit console so that control or data signals can be transferred between the cockpit consoles and control component 10. One or both of circuit board 34 and second circuitry may be founded to a frame, for example, a frame 46. Thus, control component 10 may also include one or more EECs, ECUs, EHMs, FADECs. Control circuitry 19 may collectively refer to one or more circuitry hosted by sub-components of control component 10, for example, pressure sensor card 30, external interface module 32, power supplies, the cockpit interface module, the health monitoring module, second circuitry 44, or other modules or sub-components of control component 10.

One or more sub-components of control component 12 may be manufacturing using additive manufacturing. For example, one or more of case 13, a frame for mounting a power supply, spacers 42, frame 46, or other components may be additively manufactured. While housing 12 includes exterior layer 14 or interior layer 16, other components of control component 10 may have different structures, and may not have multiple layers. One or more sub-components of control component 10 may be additively manufactured together (for example, within a single additive manufacturing run or batch) or as an integrated sub-structure, and other components may be additively manufactured separately. One or more sub-components may be manufactured by other techniques, for example, molding, casting, injection molding, stamping, machining, or any other suitable technique.

Example control components including a housing including an exterior layer and an interior layer including a conductive material have been described above. As described above, additive manufacturing may be used to fabricate a structure, for example, a unitary structure, including an integrated or continuous exterior layer and an interior layer, or a discrete structure including discrete sub-components. Example control components or sub-components may be fabricated using additive manufacturing, for example, using the example system of FIG. 4, and the example technique of FIG. 5, as discussed below. However, example components described with reference to FIGS. 1A, 1B, 1C, 2, and 3 above may be fabricated using other suitable example systems or other suitable example techniques.

Figure 4:
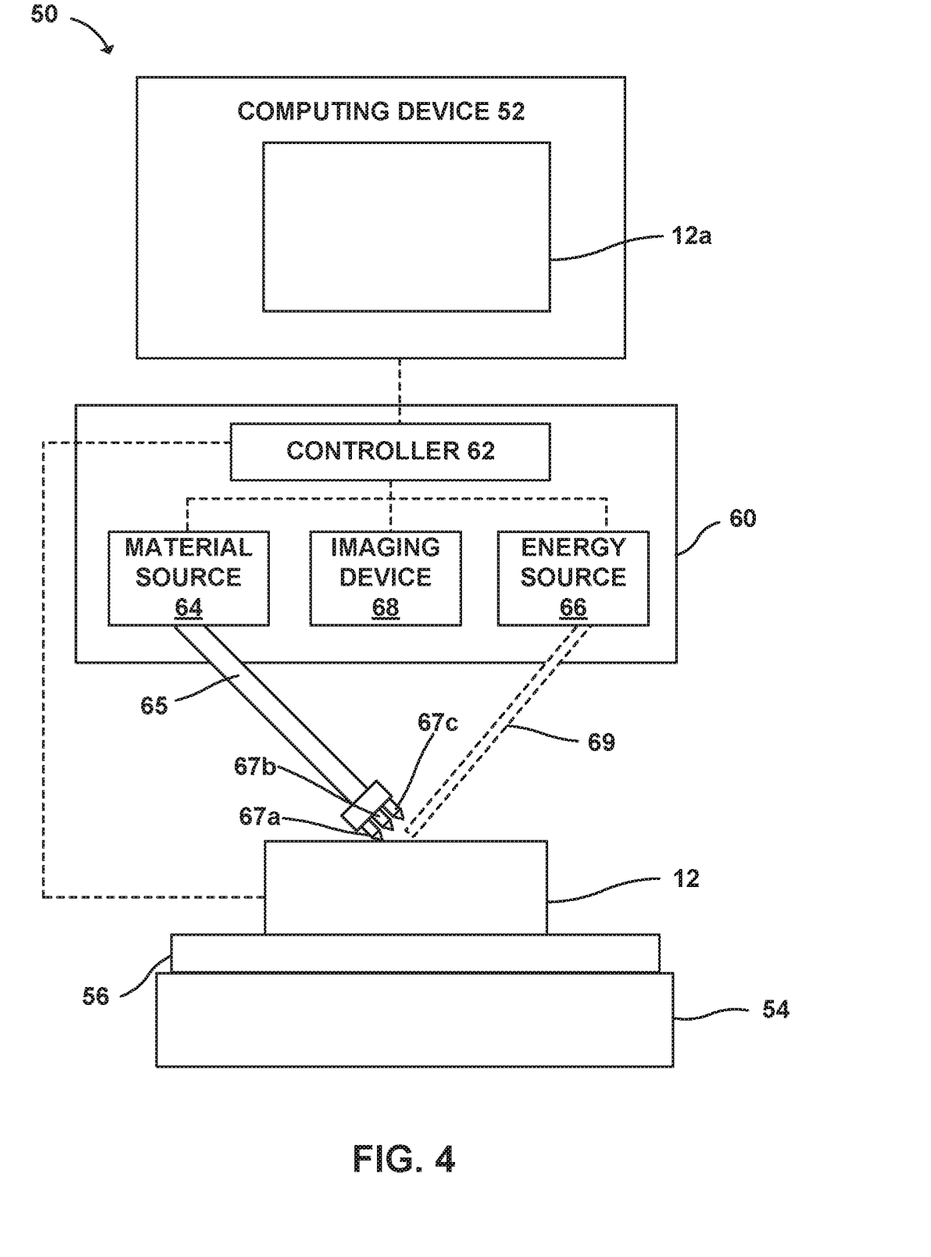
FIG. 4 is a schematic and conceptual block diagram of an example system for fabricating a control component for an engine, the control component including a housing including an exterior layer and an interior polymeric layer.

FIG. 4 is a schematic and conceptual block diagram of an example system 50 for fabricating control component 10 for engine 15, control component 10 including housing 12 including exterior layer 14 and interior polymeric layer 16. Example system 50 includes a computing device 52 that may control an additive manufacturing tool 60 for fabricating housing 12 of control component 10. In some examples, computing device 52 may generate or store a digital representation 12a of housing 12, or of control component 10 that includes housing 12. In some examples, computing device 52 may control additive manufacturing tool 60 to fabricate housing 12 or component 10 including housing 12 based on digital representation 12a. In some examples, additive manufacturing tool 60 may include a controller 62 for controlling one or more of a material source 64, an energy source 66, and an imaging device 68.

Computing device 52 may send control signals to controller 62 for controlling additive manufacturing tool 60. For example, computing device 52 may send operational signals to and receive status signals from controller 62 to control and monitor the operation of additive manufacturing tool 60. In some examples, computing device 52 may not control additive manufacturing tool 60, and controller 62 may be configured to receive signals indicative of digital representation 12a from computing device 52 and to control additive manufacturing tool 60 based on digital representation 12a to fabricate the component including housing 12.

In some examples, controller 62 may control material source 64 of additive manufacturing tool 60 to direct material stream 65 including at least one material through at least one of nozzles 67a, 67b, or 67c at a build location on partially-fabricated housing 12, which is carried on a build platform 54, or at an initial build location on a region of a substrate 56 on build platform 54. In some examples, the at least one material may include one or more of a metal, an alloy, a polymer, a conductive polymer, or a conductive material, or any suitable material composition discussed above with reference to control component 10 or housing 12 of FIGS. 1A, 1B, and 1C. For example, material stream 65 may carry more than one material streams including respective materials from source 64 to be respectively ejected or deposited from different nozzles 67a, 67b, or 67c. While system 50 includes three nozzles 67a, 67b, and 67c in the example shown in FIG. 4, system 50 may include fewer nozzles (for example, one or two nozzles), or more than three nozzles. In some examples, one or more of nozzles 67a, 67b, and 67c may respectively eject or deposit a first material, a second material, and a third material. In some examples, any one the nozzles of system 50, for example, any of nozzles 67a, 67b, and 67c, may be capable of depositing or ejecting any predetermined material or combinations or materials. For example, controller 62 may control material 64 to respectively deposit respective single materials or respective combinations of material through one or more of nozzles 67a, 67b, or 67c. In some examples, controller 62 may control material source 64 and material stream 65 such that one nozzle deposits a composition including a polymer and a conductive material. In other examples, controller 62 may cause one of nozzles 67a, 67b, or 67c deposits a composition including a polymer, and another of nozzles 67a, 67b, or 67c deposits a composition including a conductive material.

Controller 62 also may control energy source 66 to direct at least one energy beam 69 at the build location. Energy beam 69 may interact with at least one material from material stream 65 at the build location, for example, by fusing, melting, sintering, curing, solidifying or otherwise modifying the at least one material at the build location to cause the at least one material to be joined to other material of housing 12 at the build location, or to material of substrate 56. Energy beam 69 may include any energy, for example, ultraviolet light, electron beam, plasma, or laser, that may interact with the at least one material to change a state of the at least one material. For example, energy beam 69 may be focusable or directable towards material flowing from material stream 65 through nozzles 67a, 67b, or 67c. In some examples, the build location at which energy beam 69 interacts with material from material stream 65 is adjacent an existing surface of housing 12 such that material is added to housing 12. In some examples, controller 62 may control energy source 66 to emit a diffuse energy beam, or a patterned array of beams, for example, a light pattern. The build location may change as housing 12 is fabricated, for example, along regions or surfaces of partly fabricated housing 12. In some examples, controller 62 may cause additive manufacturing tool 60 to fabricate housing 12 by depositing material at different build locations along a tool path, so that material is ultimately deposited along a predetermined build direction, for example a vertical build direction upwards (for example, against a gravitational force) or downwards (for example, toward a gravitational force).

In some examples, build platform 54 may remain stationary as housing 12 is fabricated. In other examples, build platform 54 may be movable or rotatable, for example, along multiple axis, and controller 62 may control the position of build platform 54. In some examples, controller 62 may successively move build platform 54 against the build direction, or to change the build location by changing the orientation of build platform 54, and that of housing 12, relative to material stream 54 and energy beam 69.

In some examples, controller 62 may separately control material source 64 and energy source 66, for example, by separately controlling material source 64 to direct material stream 65 to deposit a layer or volume of material, and then controlling energy source 66 to direct energy beam 69 along a series of build locations within the deposited layer or volume of material to energize material at the build locations to fabricate housing 12. Therefore, controller 62 may direct build location along a two-dimensional or three-dimensional tool path to fabricate housing 12 based on digital representation 12a.

In some examples, controller 62 may control imaging device 68 to image surfaces or regions or volumes of one or more of housing 12, the build location, substrate 56, or platform 54 to generate respective build images periodically or continuously. Controller 62 may periodically or continuously compare the build images with the digital representation 12a to verify that housing 12 substantially conforms (e.g., conforms or nearly conforms) to digital representation 12a. In some examples, controller 62 may control one or more of material source 64, energy source 66, and build platform 54 based on the build images and the digital representation 12a. For example, controller 62 may be configured to control build platform 54 and material source 64, energy source 66, and/or imaging device 68 to translate and/or rotate along at least one axis to position housing 12 relative to material stream 65, energy beam 69, and/or imaging device 68. Positioning housing 12 relative to material stream 65, energy beam 69, and/or imaging device 68 may include positioning a predetermined surface (e.g., a surface to which material is to be added) of housing 12 in a predetermined orientation relative to material source 65, energy source 66, and/or imaging device 68, so that material is added in regions or volumes defined by digital representation 12a.

In some examples, additive manufacturing tool 60 may not include controller 62, and computing device 52 may control one or more of material source 64, energy source 66, imaging device 68, and build platform 54, instead of controller 62.

Example system 50 discussed above may be used to fabricate example components described above with reference to FIGS. 1A through 3. However, example system 50 may be used to fabricate other example components according to the disclosure.

Figure 5:
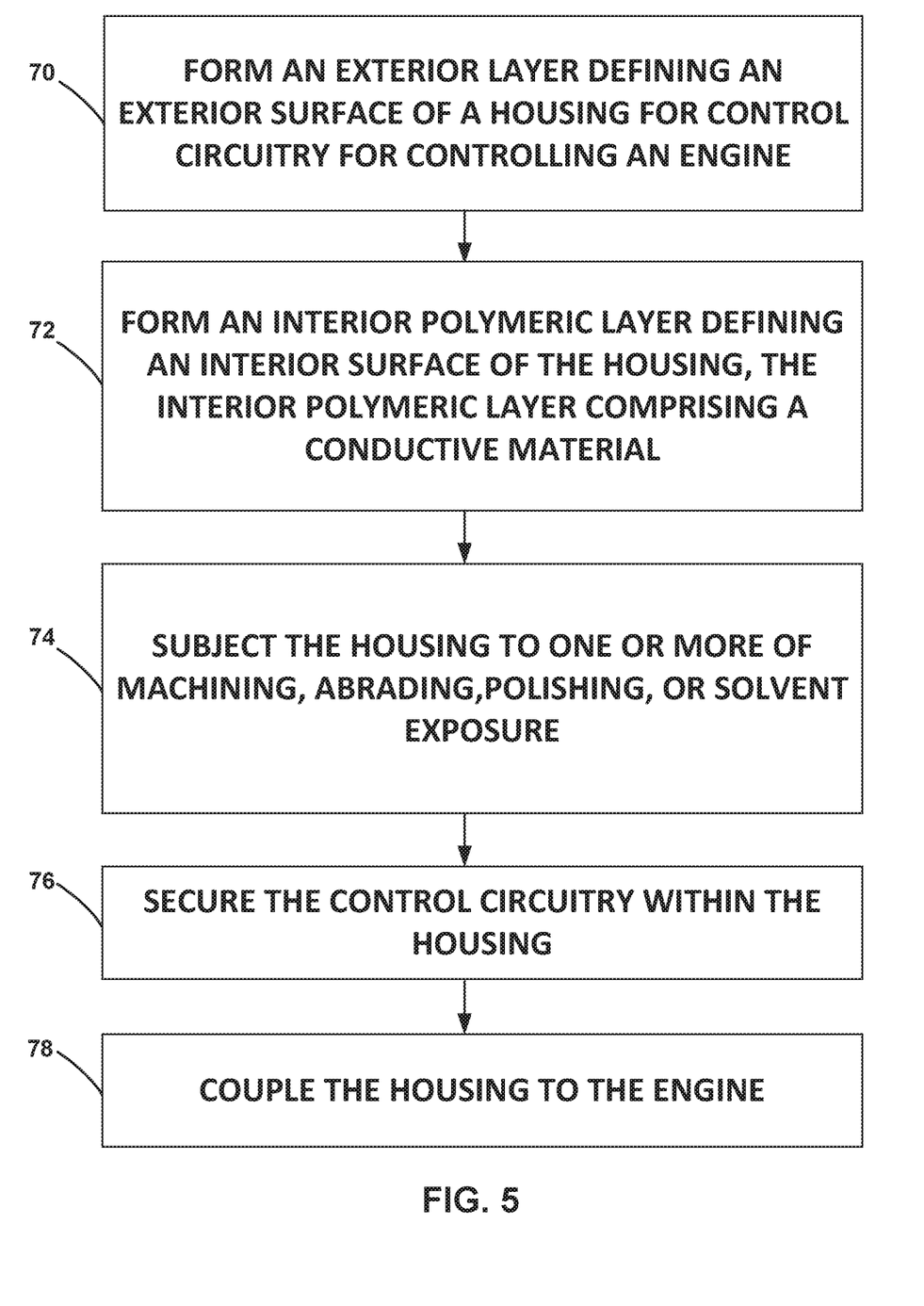
FIG. 5 is a flow diagram of an example technique for fabricating a control component for an engine, the control component including a housing including an exterior layer and an interior polymeric layer.

FIG. 5 is a flow diagram illustrating an example technique for fabricating a control component for an engine, the control component including a housing including a first conductive layer and a second structural layer. While the technique of FIG. 5 is described with respect to control component 10 and housing 12 of FIGS. 1 through 3, and system 50 of FIG. 4, it will be understood from the context of the specification that the technique of FIG. 5 may be implemented using other systems, or applied to other components of an engine including, for example, housings or casings for other components, or the like; all of which are envisioned within the scope of the technique of FIG. 5.

The example technique of FIG. 5 includes fabricating control component 10 by additively manufacturing housing 12. As discussed with reference to FIGS. 1A, 1B, 1C, 2, and 3, above, housing 12 includes exterior layer 14 and interior layer 16 including conductive material 22. In some examples, the example technique includes forming exterior layer 14 defining exterior surface 14a of housing 12 (70). The forming exterior layer 14 may include one or more of molding, machining, or additive deposition. For example, the forming exterior layer 14 (70) may include molding a composition in a mold, or machining a substrate, or additively depositing a composition.

The example technique includes forming interior polymeric layer 16 (72). In some examples, forming interior polymeric layer 16 (72) includes additively depositing a composition including a polymer and a conductive material, or by additively depositing a first composition including a polymer, and a second composition including a conductive material. For example, controller 62 may control material source 64 to deliver material stream 65 including the polymer and the conductive material separately or in combination through one or more of nozzles 67a, 67b, or 67c. For example, one or both of forming interior polymeric layer 16 (72) or forming exterior layer 14 may include one or more of depositing a first polymer composition from first nozzle 67a, depositing a second polymer composition from second nozzle 67b, or depositing conductive material 22 from third nozzle 67c. In other examples, one or both of forming interior polymeric layer 16 (72) or forming exterior layer 14 (70) includes depositing a polymer composition comprising a conductive material from one of nozzles 67a, 67b, or 67c. In some examples, forming interior polymeric layer 16 (72) or forming exterior layer 14 (70) may include depositing a temporary polymer composition that forms a temporary structure (for example, a scaffold) or that supports a primary structure of interior polymeric layer 16 or exterior layer 14. In some examples, the temporary polymer composition includes polyvinyl alcohol (PVA). The temporary polymer composition may be removed after forming exterior layer 14 (70) or forming interior polymeric layer 16 (72), for example, by mechanical separation, heating, dissolution in solvent, or any suitable technique for removing the temporary polymer composition without substantially modifying or affecting exterior layer 14 or interior polymeric layer 16.

Forming exterior layer 14 (70) or forming interior polymeric layer 16 (72) may further including curing or solidifying a deposited material. For example, controller 62 may control material stream 65 and energy stream 69 at a focal region on a surface of substrate 56, or on a surface of partially fabricated housing 12. In some examples, additively depositing housing 12 includes moving the focal region along a predetermined path. For example, controller 62 may control energy beam 69 and material stream 65 such that energy beam 69 interacts with portions, volumes, or packets of material from material stream 65, for example, by fusing, solidifying, or sintering material from material stream 65 at a series of focal regions along the tool path, to deposit volumes of material along the tool path. In some examples, controller 62 may deposit successive layers of material that ultimately form housing 12. For example, controller 62 may direct material stream 65 and energy beam 69 to deposit material in layers, the layers defining portions of housing 12. Thus, one or both of forming interior polymeric layer 16 (72) or forming exterior layer 14 (70) may include one or more additive manufacturing techniques such as fused deposition modeling, vat polymerization, stereolithography, digital light processing, selective laser sintering, selective laser melting, or electronic beam melting.

In some examples, controller 62 may direct deposition of material on substrate 56 in a predetermined build direction, for example, a vertical direction pointing away from substrate 56. Thus, controller 62 may direct material along the build direction, beginning with layers of material on or adjacent a surface of substrate 56 and then continuing to deposit layers that are successively farther away from the surface of substrate 56. For example, controller 62 may first direct material stream 65 and energy beam 69 to deposit layers of material forming base 20, and then continue depositing material along the tool path forming layers of material that eventually form case 13. Base 20 may be separated from case 13 by cutting or another secondary operation. In other examples, controller may first direct material stream 65 and energy beam 69 to deposit layers of material forming base 20, which may be removed from substrate 56, and then direct material stream 65 and energy beam 69 to deposit layers of material forming case 13, thus forming base 20 and case 13 separately.

In some examples, digital representation 12*a* may include a representation of one or more of mounting brackets 26 or openings 28. Controller 62 may direct material stream 65 and energy beam 69 around regions defining cooling apertures 28, for example, by depositing layers that define successive cross-sections of predetermined voids that eventually define openings 28, or by depositing successive cross-sections of protrusions that eventually define mounting brackets 26. Thus, in some examples, system 50 may fabricate housing 12 that defines openings 28 or mounting brackets 26. In some examples, housing 12 may be fabricated without mounting brackets 26 or openings 28, and openings may be formed after the additive manufacturing, for example, by machining or drilling apertures through housing 12. Mounting brackets 26 may be separately formed by one or more of additive manufacturing, molding, or, machining, and may be joined to housing 12.

While forming exterior layer 14 (70) and forming interior polymeric layer 16 (72) have been shown separately in the flowchart of FIG. 5, in some examples, the example technique of FIG. 5 may include simultaneously forming at least respective portions of exterior layer 14 and interior polymeric layer 16. For example, controller 62 may control material source 64 and energy source 66 such that adjacent portions of exterior layer 14 and interior polymer layer 16 are formed substantially simultaneously. In other examples, one of exterior layer 14 and interior polymer layer 16 may be formed before the other of exterior layer 14 and interior polymer layer 16. For example, forming exterior layer 14 (70) may precede forming interior polymeric layer 16 (72), where forming interior polymeric layer 16 includes additively depositing interior polymeric layer 16 on a surface defined by exterior layer 14. For example, substrate 56 may include pre-formed exterior layer 14, and controller 62 may control material source 64 and energy source 66 to cause interior polymeric layer 16 to be formed on exterior layer 14. Contrariwise, forming interior polymeric layer 16 may precede forming exterior layer 14, where forming exterior layer 14 includes additively depositing exterior layer 16 on a surface defined by interior polymeric layer 16. For example, substrate 56 may include pre-formed interior polymeric layer 16, and controller 62 may control material source 64 and energy source 66 to cause exterior layer 14 to be formed on interior polymeric layer 14.

Thus, example techniques may include additive manufacturing to form housing 12 including exterior layer 14 and interior polymeric layer 16 adjacent to and substantially coextensive with exterior layer 14. Housing 12 may be subject to further processing after the additive manufacturing. For example, the example technique of FIG. 5 may include post-processing housing 12 by subjecting housing 12 (including interior polymeric layer 16 or exterior layer 14) to one or more of machining, abrading, polishing, or solvent exposure (74). For example, machining may be used to remove material from one or more portions of housing 12, to define channels, openings, or other features. One or more surfaces of housing 12 may be abraded or polished to change a thickness or surface roughness or fineness. Housing 12 or a portion of housing 12 may be exposed to a solvent capable of dissolving at least one component or material of housing 12. For example, housing 12 may include a polymer susceptible to a predetermined solvent, and exposure to the may smoothen or polish one or more surfaces of housing 12. The solvent exposure may include immersing housing 12 in the solvent, or may include exposing housing 12 to vapors of the solvent. The solvent may include acetone, water or steam, or sodium hydroxide, or any suitable solvent according to the susceptibility of a polymer in housing 12.

Once housing 12 is formed, control circuitry 19 may be secured within housing 12 (76). For example, base 20 may be separated from case 13, control circuitry 19 may be assembled with other components, and placed in cavity 18, and base 20 secured to case 13 to enclose or otherwise secure control circuitry 19 within housing 12.

The example technique of FIG. 5 may include coupling housing 12 to engine (78). For example, control component 10 may be installed in engine and electrically coupled to a cockpit console or a flight computer. In some examples, installing control component 10 includes bonding housing 12 to a surface of engine 15.

While the example technique of FIG. 5 may be used to fabricate example components described above with reference to FIGS. 1A, 1B, 1C, 2, and 3, and with reference to example system 50 of FIG. 4, the example technique of FIG. 5 may be used to fabricate other example components using other example systems.

Clause 1: A control component for controlling an engine, the control component including: a housing defining a cavity configured to receive control circuitry, the control circuitry being configured to control the engine, the housing including: an exterior layer defining an exterior surface of the housing; and an interior polymeric layer defining an interior surface of the housing, wherein the interior polymeric layer includes an electrically and thermally conductive material, and wherein the interior polymeric layer is adjacent to and substantially coextensive with the exterior layer.

Clause 2: The control component of clause 1, wherein the electrically and thermally conductive material includes one or more of an electrically and thermally conductive polymer, a metal, or an alloy.

Clause 3: The control component of clause 2, wherein the electrically and thermally conductive material includes the electrically and thermally conductive polymer, and wherein the interior polymeric layer further includes a second polymer different from the electrically and thermally conductive polymer.

Clause 4: The control component of clause 2, wherein the interior polymeric layer consists essentially of the electrically and thermally conductive polymer.

Clause 5: The control component of any one of clauses 1 to 4, wherein the exterior layer includes one or more of a polymer, a metal, or an alloy.

Clause 6: The control component of clause 5, wherein the exterior layer and the interior polymeric layer comprise the same polymer, and wherein the polymer defines a polymer matrix extending continuously through both the interior polymeric layer and the exterior layer.

Clause 7: The control component of clause 6, wherein the interior polymeric layer seamlessly transitions into the exterior layer.

Clause 8: The control component of any one of clauses 1 to 7, wherein the housing includes a unitary structure defining the interior polymeric layer and the exterior layer.

Clause 9: The control component of any one of clauses 1 to 8, further including the control circuitry.

Clause 10: The control component of any one of clauses 1 to 9, wherein the conductive material forms a faraday cage or a faraday shield surrounding the cavity, wherein the faraday cage or the faraday shield shields the cavity from external electromagnetic interference.

Clause 11: A technique including forming an exterior layer defining an exterior surface of a housing of a control component; and forming an interior polymeric layer defining an interior surface of the housing, the interior polymeric layer including an electrically and thermally conductive material, the housing defining a cavity configured to receive control circuitry, the control circuitry being configured to control an engine.

Clause 12: The technique of clause 11, wherein forming the exterior layer includes one or more of molding, machining, or additive deposition.

Clause 13: The technique of clause 11 or 12, wherein forming the interior polymeric layer includes additively depositing the interior polymeric layer.

Clause 14: The technique of clause 13, wherein forming the exterior layer precedes forming the interior polymeric layer, and wherein forming the interior polymeric layer includes additively depositing the interior polymeric layer on a surface defined by the exterior layer.

Clause 15: The technique of clause 13, wherein forming the interior polymeric layer precedes forming the exterior layer, and wherein forming the exterior layer includes additively depositing the exterior layer on a surface defined by the interior polymeric layer.

Clause 16: The technique of any one of clauses 11 to 15, wherein one or both of forming the interior polymeric layer or forming the exterior layer includes depositing a polymer composition from a first nozzle and depositing the electrically and thermally conductive material from a different second nozzle.

Clause 17: The technique of any one of clauses 11 to 15, wherein one or both of forming the interior polymeric layer or forming the exterior layer includes depositing a polymer composition including the electrically and thermally conductive material from a single nozzle.

Clause 18: The technique of any one of clauses 11 to 17, wherein one or both of forming the interior polymeric layer or forming the exterior layer includes one or more of fused deposition modeling, vat polymerization, stereolithography, digital light processing, selective laser sintering, selective laser melting, or electronic beam melting.

Clause 19: The technique of any one of clauses 11 to 18, further including post-processing the housing by subjecting the housing to one or more of machining, abrading, polishing, or solvent exposure.

Clause 20: The technique of any one of clauses 11 to 19, further including securing the control circuitry within the housing.

Various examples have been described. These and other examples are within the scope of the following claims.

What is claimed is:

1. A control component for controlling an engine, the control component comprising:
    a monolithic housing defining a cavity configured to receive control circuitry, the control circuitry being configured to control the engine, the monolithic housing comprising:
        an exterior polymeric layer defining an exterior surface of the monolithic housing; and
        an interior polymeric layer defining an interior surface of the monolithic housing, wherein the interior polymeric layer comprises:
            a polymer matrix; and
            an electrically and thermally conductive material comprising discrete particles dispersed within the polymer matrix in a predetermined mesh pattern having an inter-mesh spacing to define a Faraday cage,
    wherein the interior polymeric layer is adjacent to and substantially coextensive with the exterior polymeric layer,
    wherein the exterior polymeric layer and the interior polymeric layer comprise the same polymer,
    wherein the polymer defines the polymer matrix extending continuously through both the interior polymeric layer and the exterior polymeric layer to form the monolithic housing, and
    wherein the interior polymeric layer has a higher concentration of the electrically and thermally conductive material than the exterior polymeric layer.

2. The control component of claim 1, wherein the electrically and thermally conductive material comprises one or more of an electrically and thermally conductive polymer, a metal, or an alloy.

3. The control component of claim 2, wherein the electrically and thermally conductive material comprises the electrically and thermally conductive polymer, and wherein the interior polymeric layer further comprises a second polymer different from the electrically and thermally conductive polymer.

4. The control component of claim 1, wherein the interior polymeric layer seamlessly transitions into the exterior polymeric layer such that there is no distinct interface between the interior polymeric layer and the exterior polymeric layer.

5. The control component of claim 1, wherein the monolithic housing comprises a unitary structure defining the interior polymeric layer and the exterior polymeric layer.

6. The control component of claim 1, further comprising the control circuitry.

7. The control component of claim 1, wherein the Faraday cage shields the cavity from external electromagnetic interference.

8. The control component of claim 4, wherein the electrically and thermally conductive material is dispersed within the exterior polymeric layer.

9. The control component of claim 1, wherein the Faraday cage comprises a geometry configured to attenuate a predetermined range of electromagnetic frequencies corresponding to the inter-mesh spacing of the mesh pattern.

10. A method comprising
forming an exterior polymeric layer defining an exterior surface of a monolithic housing of a control component; and
forming an interior polymeric layer defining an interior surface of the monolithic housing, the interior polymeric layer comprising a polymer matrix and an electrically and thermally conductive material comprising discrete particles dispersed within the polymer matrix in a predetermined mesh pattern having an inter-mesh spacing to define a Faraday cage,
the monolithic housing defining a cavity configured to receive control circuitry, the control circuitry being configured to control an engine,
wherein the interior polymeric layer is adjacent to and substantially coextensive with the exterior polymeric layer,
wherein the exterior polymeric layer and the interior polymeric layer comprise the same polymer,
wherein the polymer defines a polymer matrix extending continuously through both the interior polymeric layer and the exterior polymeric layer to form the monolithic housing, and
wherein the interior polymeric layer has a higher concentration of the electrically and thermally conductive material than the exterior polymeric layer.

11. The method of claim 10, wherein forming the exterior polymeric layer comprises one or more of molding, machining, or additive deposition.

12. The method of claim 10, wherein forming the interior polymeric layer comprises additively depositing the interior polymeric layer.

13. The method of claim 12, wherein forming the exterior polymeric layer precedes forming the interior polymeric layer, and wherein forming the interior polymeric layer comprises additively depositing the interior polymeric layer on a surface defined by the exterior polymeric layer.

14. The method of claim 12, wherein forming the interior polymeric layer precedes forming the exterior polymeric layer, and wherein forming the exterior polymeric layer comprises additively depositing the exterior polymeric layer on a surface defined by the interior polymeric layer.

15. The method of claim 10, wherein one or both of forming the interior polymeric layer or forming the exterior polymeric layer comprises depositing a polymer composition from a first nozzle and depositing the electrically and thermally conductive material from a different second nozzle.

16. The method of claim 10, wherein one or both of forming the interior polymeric layer or forming the exterior polymeric layer comprises depositing a polymer composition comprising the electrically and thermally conductive material from a single nozzle.

17. The method of claim 10, wherein one or both of forming the interior polymeric layer or forming the exterior polymeric layer comprises one or more of fused deposition modeling, vat polymerization, stereolithography, digital light processing, selective laser sintering, selective laser melting, or electronic beam melting.

18. The method of claim 10, further comprising post-processing the monolithic housing by subjecting the monolithic housing to one or more of machining, abrading, polishing, or solvent exposure.

19. The method of claim 10, further comprising securing the control circuitry within the monolithic housing.

20. A control component for controlling an engine, the control component comprising:
a monolithic housing defining a cavity configured to receive control circuitry, the control circuitry being configured to control the engine, the monolithic housing comprising:
an exterior polymeric layer defining an exterior surface of the monolithic housing; and
an interior polymeric layer defining an interior surface of the monolithic housing, wherein the interior polymeric layer comprises:
a polymer matrix; and
an electrically and thermally conductive material comprising discrete particles dispersed within the polymer matrix in a predetermined mesh pattern having an inter-mesh spacing to define a Faraday cage,
wherein the interior polymeric layer is adjacent to and substantially coextensive with the exterior polymeric layer,
wherein the exterior polymeric layer and the interior polymeric layer comprise the same polymer,
wherein the polymer defines the polymer matrix extending continuously through both the interior polymeric layer and the exterior polymeric layer to form the monolithic housing, and
wherein the monolithic housing defines a gradient of the electrically and thermally conductive material between the interior surface and the exterior surface.

* * * * *